(12) United States Patent
Clark, Jr. et al.

(10) Patent No.: US 7,166,515 B2
(45) Date of Patent: Jan. 23, 2007

(54) IMPLANTED HIDDEN INTERCONNECTIONS IN A SEMICONDUCTOR DEVICE FOR PREVENTING REVERSE ENGINEERING

(75) Inventors: William M. Clark, Jr., Camarillo, CA (US); James P. Baukus, Westlake Village, CA (US); Lap-Wai Chow, South Pasadena, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/132,523

(22) Filed: Apr. 24, 2002

(65) Prior Publication Data

US 2002/0173131 A1 Nov. 21, 2002

Related U.S. Application Data

(63) Continuation-in-part of application No. 09/696,826, filed on Oct. 25, 2000, now Pat. No. 6,815,816.

(51) Int. Cl.
*H01L 21/336* (2006.01)

(52) U.S. Cl. .................. 438/298; 438/514; 438/598

(58) Field of Classification Search ............ 438/514, 438/598, 298, 510; 257/376, 390, 398, 399, 257/400, 648, 900
See application file for complete search history.

(56) References Cited

U.S. PATENT DOCUMENTS

| | | | |
|---|---|---|---|
| 3,673,471 A | 6/1972 | Klein et al. | 317/235 R |
| 3,946,426 A | 3/1976 | Sanders | 357/71 |
| 3,983,620 A | 10/1976 | Spadea | 438/218 |
| 4,017,888 A | 4/1977 | Christie et al. | 357/54 |
| 4,101,344 A * | 7/1978 | Kooi et al. | 438/280 |
| 4,139,864 A | 2/1979 | Schulman | 358/188 |
| 4,145,701 A | 3/1979 | Kawagoe | 257/391 |
| 4,164,461 A | 8/1979 | Schilling | 204/192 EC |
| 4,196,443 A | 4/1980 | Dingwall | 357/68 |
| 4,267,578 A | 5/1981 | Vetter | 364/709 |

(Continued)

FOREIGN PATENT DOCUMENTS

EP 0 186 855 A2 7/1986

(Continued)

OTHER PUBLICATIONS

Blythe, et al., "Layout Reconstruction of Complex Silicon Chips," *IEEE Journal of Solid-State Circuits*, pp. 138-145 (Feb. 1993).

(Continued)

*Primary Examiner*—Brook Kebede
*Assistant Examiner*—Khiem Nguyen
(74) *Attorney, Agent, or Firm*—Ladas & Parry LLP

(57) ABSTRACT

A camouflaged interconnection for interconnecting two spaced-apart regions of a common conductivity type in an integrated circuit or device and a method of forming same. The camouflaged interconnection comprises a first region forming a conducting channel between the two spaced-apart regions, the conducting channel being of the same common conductivity type and bridging a region between the two spaced-apart regions, and a second region of opposite conductivity to type, the second region being disposed between the two spaced-apart regions of common conductivity type and over lying the conducting channel to camouflage the conducting channel from reverse engineering.

25 Claims, 2 Drawing Sheets

U.S. PATENT DOCUMENTS

| | | | |
|---|---|---|---|
| 4,291,391 A | 9/1981 | Chatterjee et al. | 365/184 |
| 4,295,897 A | 10/1981 | Tubbs et al. | 148/1.5 |
| 4,314,268 A | 2/1982 | Yoshioka et al. | 357/48 |
| 4,317,273 A | 3/1982 | Guterman et al. | 29/571 |
| 4,322,736 A | 3/1982 | Sasaki et al. | 257/369 |
| 4,374,454 A | 2/1983 | Jochems | 29/571 |
| 4,393,575 A * | 7/1983 | Dunkley et al. | 438/186 |
| 4,409,434 A | 10/1983 | Basset et al. | 380/265 |
| 4,435,895 A | 3/1984 | Parillo | 29/571 |
| 4,471,376 A | 9/1984 | Morcom et al. | 357/71 |
| 4,493,740 A | 1/1985 | Komeda | 438/431 |
| 4,530,150 A | 7/1985 | Shirato | 29/576 B |
| 4,581,628 A | 4/1986 | Miyauchi et al. | 357/71 |
| 4,583,011 A | 4/1986 | Pechar | 307/440 |
| 4,603,381 A | 7/1986 | Guttag et al. | 364/200 |
| 4,623,255 A | 11/1986 | Suszko | 356/389 |
| 4,636,822 A | 1/1987 | Codella et al. | 257/345 |
| 4,727,038 A | 2/1988 | Watabe et al. | 438/304 |
| 4,727,493 A | 2/1988 | Taylor, Sr. | 364/490 |
| 4,729,001 A | 3/1988 | Haskel | 257/345 |
| 4,753,897 A | 6/1988 | Lund et al. | 438/296 |
| 4,766,516 A | 8/1988 | Ozdemir et al. | 361/380 |
| 4,771,012 A | 9/1988 | Yabu et al. | 438/286 |
| 4,799,096 A | 1/1989 | Koeppe | 357/42 |
| 4,821,085 A | 4/1989 | Haken et al. | 357/67 |
| 4,829,356 A * | 5/1989 | Arndt | 257/370 |
| 4,830,974 A | 5/1989 | Chang et al. | 437/34 |
| 4,860,084 A | 8/1989 | Shibata | 257/288 |
| 4,912,053 A * | 3/1990 | Schrantz | 438/188 |
| 4,939,567 A | 7/1990 | Kenney | 257/383 |
| 4,962,484 A | 10/1990 | Takeshima et al. | 365/226 |
| 4,975,756 A | 12/1990 | Haken et al. | 357/4.1 |
| 4,998,151 A | 3/1991 | Korman et al. | 257/328 |
| 5,015,596 A * | 5/1991 | Toyoda et al. | 438/186 |
| 5,030,796 A | 7/1991 | Swanson et al. | 174/52.2 |
| 5,050,123 A | 9/1991 | Castro | 365/53 |
| 5,061,978 A | 10/1991 | Mizutani et al. | 357/30 |
| 5,065,208 A | 11/1991 | Shah et al. | 357/34 |
| 5,068,697 A | 11/1991 | Noda et al. | 357/23.5 |
| 5,070,378 A | 12/1991 | Yamagata | 357/23.5 |
| 5,073,812 A | 12/1991 | Shimura | 357/34 |
| 5,101,121 A | 3/1992 | Sourgen | 307/465 |
| 5,117,276 A | 5/1992 | Thomas et al. | 357/71 |
| 5,120,669 A * | 6/1992 | Schrantz | 438/186 |
| 5,121,089 A | 6/1992 | Larson et al. | 333/107 |
| 5,121,186 A | 6/1992 | Wong et al. | 257/384 |
| 5,132,571 A | 7/1992 | McCollum et al. | 307/465.1 |
| 5,138,197 A | 8/1992 | Kuwana | 307/449 |
| 5,146,117 A | 9/1992 | Larson | 307/465 |
| 5,168,340 A | 12/1992 | Nishimura | 357/376 |
| 5,177,589 A | 1/1993 | Kobayashi et al. | 257/773 |
| 5,202,591 A | 4/1993 | Walden | 307/450 |
| 5,210,437 A | 5/1993 | Sawada et al. | 257/392 |
| 5,225,699 A | 7/1993 | Nakamura | 257/306 |
| 5,227,649 A | 7/1993 | Chapman | 257/316 |
| 5,231,299 A | 7/1993 | Ning et al. | 257/316 |
| 5,302,539 A | 4/1994 | Haken et al. | 437/41 |
| 5,308,682 A | 5/1994 | Morikawa | 428/195 |
| 5,309,015 A | 5/1994 | Kuwata et al. | 257/659 |
| 5,317,197 A | 5/1994 | Roberts | 257/401 |
| 5,336,624 A * | 8/1994 | Walden | 438/200 |
| 5,341,013 A | 8/1994 | Koyanagi et al. | 257/368 |
| 5,345,105 A | 9/1994 | Sun et al. | 257/659 |
| 5,354,704 A | 10/1994 | Yang et al. | 437/52 |
| 5,369,299 A | 11/1994 | Byrne et al. | 257/638 |
| 5,371,390 A | 12/1994 | Mohsen | 257/209 |
| 5,376,577 A | 12/1994 | Roberts et al. | 437/52 |
| 5,378,641 A | 1/1995 | Cheffings | 438/286 |
| 5,384,472 A | 1/1995 | Yin | 257/204 |
| 5,384,475 A * | 1/1995 | Yahata | 257/314 |
| 5,399,441 A | 3/1995 | Bearinger et al. | 428/689 |
| 5,404,040 A | 4/1995 | Hshieh et al. | 257/341 |
| 5,412,237 A | 5/1995 | Komori et al. | 257/306 |
| 5,441,902 A | 8/1995 | Hsieh et al. | 437/34 |
| 5,468,990 A | 11/1995 | Daum | 257/632 |
| 5,475,251 A | 12/1995 | Kuo et al. | 257/316 |
| 5,506,806 A | 4/1996 | Fukushima | 365/195 |
| 5,531,018 A | 7/1996 | Saia et al. | 29/622 |
| 5,539,224 A | 7/1996 | Ema | 257/211 |
| 5,541,614 A | 7/1996 | Lam et al. | 343/792.5 |
| 5,571,735 A | 11/1996 | Mogami et al. | 437/41 |
| 5,576,988 A | 11/1996 | Kuo et al. | 365/185.04 |
| 5,611,940 A | 3/1997 | Zettler | 73/514.16 |
| 5,638,946 A | 6/1997 | Zavracky | 200/181 |
| 5,677,557 A | 10/1997 | Wuu et al. | 257/382 |
| 5,679,595 A | 10/1997 | Chen et al. | 437/52 |
| 5,719,422 A | 2/1998 | Burr et al. | 257/336 |
| 5,719,430 A | 2/1998 | Goto | 257/403 |
| 5,721,150 A | 2/1998 | Pasch | 437/46 |
| 5,783,375 A | 7/1998 | Twist | 430/414 |
| 5,783,846 A | 7/1998 | Baukus et al. | 257/204 |
| 5,821,147 A | 10/1998 | Kizilyali | 438/305 |
| 5,821,590 A | 10/1998 | Lee et al. | 257/377 |
| 5,838,047 A | 11/1998 | Yamauchi et al. | 257/372 |
| 5,854,510 A | 12/1998 | Sur, Jr. et al. | 257/529 |
| 5,858,843 A | 1/1999 | Doyle et al. | 438/299 |
| 5,866,933 A | 2/1999 | Baukus et al. | 257/368 |
| 5,880,503 A | 3/1999 | Matsumoto et al. | 257/372 |
| 5,888,887 A | 3/1999 | Li et al. | 438/525 |
| 5,895,241 A | 4/1999 | Lu et al. | 438/275 |
| 5,920,097 A | 7/1999 | Horne | 257/368 |
| 5,930,663 A * | 7/1999 | Baukus et al. | 438/598 |
| 5,930,667 A | 7/1999 | Oda | 438/622 |
| 5,933,737 A * | 8/1999 | Goto | 438/291 |
| 5,973,375 A * | 10/1999 | Baukus et al. | 257/399 |
| 5,977,593 A | 11/1999 | Hara | 257/356 |
| 5,998,257 A | 12/1999 | Lane et al. | 438/253 |
| 6,010,929 A | 1/2000 | Chapman | 438/226 |
| 6,037,627 A | 3/2000 | Kitamura et al. | 257/324 |
| 6,044,011 A | 3/2000 | Marr et al. | 365/154 |
| 6,046,659 A | 4/2000 | Loo et al. | 333/262 |
| 6,054,659 A | 4/2000 | Lee et al. | 200/181 |
| 6,057,520 A | 5/2000 | Goodwin-Johansson | 200/181 |
| 6,064,110 A | 5/2000 | Baukus et al. | 257/652 |
| 6,080,614 A * | 6/2000 | Neilson et al. | 438/238 |
| 6,093,609 A | 7/2000 | Chuang | 438/286 |
| 6,117,762 A | 9/2000 | Baukus et al. | 438/618 |
| 6,137,318 A | 10/2000 | Takaaki | 326/112 |
| 6,153,484 A | 11/2000 | Donaton et al. | 438/301 |
| 6,154,388 A | 11/2000 | Oh | 365/185.04 |
| 6,215,158 B1 | 4/2001 | Choi | 257/368 |
| 6,261,912 B1 | 7/2001 | Hsaio et al. | 438/301 |
| 6,294,816 B1 | 9/2001 | Baukus et al. | 257/368 |
| 6,326,675 B1 * | 12/2001 | Scott et al. | 257/608 |
| 6,365,453 B1 | 4/2002 | Deboer et al. | 438/253 |
| 6,373,106 B1 | 4/2002 | Maki et al. | 257/369 |
| 6,410,413 B1 | 6/2002 | Scott et al. | 438/601 |
| 6,479,350 B1 * | 11/2002 | Ling et al. | 438/265 |
| 6,503,787 B1 * | 1/2003 | Choi | 438/214 |
| 6,740,942 B1 | 5/2004 | Baukus et al. | 257/406 |
| 6,825,530 B1 | 11/2004 | Brown et al. | 257/337 |
| 6,911,694 B1 | 6/2005 | Negoro et al. | 257/336 |
| 6,933,560 B1 | 8/2005 | Lee et al. | 257/328 |
| 2002/0058368 A1 | 5/2002 | Tseng | 438/183 |
| 2002/0173131 A1 | 11/2002 | Clark, Jr. et al. | 438/598 |
| 2003/0057476 A1 | 3/2003 | Morita et al. | 257/327 |
| 2003/0173622 A1* | 9/2003 | Porter et al. | 257/355 |
| 2004/0061186 A1 | 4/2004 | Chow et al. | 257/399 |
| 2004/0075147 A1 | 4/2004 | Ueda et al. | 257/368 |
| 2004/0099912 A1 | 5/2004 | Chow et al. | 257/368 |

FOREIGN PATENT DOCUMENTS

| | | |
|---|---|---|
| EP | 0 364 769 | 4/1990 |

| EP | 0 463 373 | | 1/1992 |
| EP | 0 528 302 | A1 | 2/1993 |
| EP | 0 585 601 | A1 | 3/1994 |
| EP | 0 764 985 | A2 | 3/1997 |
| EP | 0 883 184 | A2 | 12/1998 |
| EP | 0 920 057 | A2 | 6/1999 |
| EP | 1 193 758 | A1 | 4/2002 |
| EP | 1 202 353 | A1 | 5/2002 |
| JP | 58-190064 | | 11/1983 |
| JP | 61-147551 | | 7/1986 |
| JP | 63 129647 | A | 6/1988 |
| JP | 02-046762 | | 2/1990 |
| JP | 2 188 944 | | 7/1990 |
| JP | 02-237038 | | 9/1990 |
| JP | 10-256398 | | 9/1998 |
| WO | 98/21734 | | 5/1998 |
| WO | 98/57373 | | 12/1998 |
| WO | 00/44012 | | 7/2000 |

OTHER PUBLICATIONS

Ng, K. K., *Complete Guide to Semiconductor Devices*, McGraw-Hill, Inc., pp. 164-165 (1995).
IBM_TDB, "Double Polysilicon Dynamic Memory Cell with Polysilicon Bit Line," pp. 3828-3831 (Feb. 1979).
IBM_TDB, "Static Ram Double Polysilicon Process," pp. 3683-3686 (Jan. 1981).
U.S. Appl. No. 09/696,826, Baukus et al.
U.S. Appl. No. 09/882,892, filed May 2004, Baukus et al.
U.S. Appl. No. 10/735,841, Chow et al.
United States Patent and Trademark Office Action, U.S. Appl. No. 09/696,826, mailed on Nov. 29, 2001, 4 pages total.
United States Patent and Trademark Office Action, U.S. Appl. No. 09/696,826, mailed on Feb. 19, 2002, 15 pages total.
United States Patent and Trademark Office Action, U.S. Appl. No. 09/696,826, mailed on Aug. 27, 2002, 10 pages total.
United States Patent and Trademark Office Action, U.S. Appl. No. 09/696,826, mailed on Mar. 27, 2003, 7 pages total.
United States Patent and Trademark Office Action, U.S. Appl. No. 09/696,826, mailed on Oct 7, 2003, 10 pages total.
United States Patent and Trademark Office Advisory Action, U.S. Appl. No. 09/696,826, mailed on Nov. 18, 2002, 7 pages total.
United States Patent and Trademark Office Supplemental Advisory Action, U.S. Appl. No. 09/696,826, mailed on Dec. 9, 2002, 3 pages total.
Response to United States Patent and Trademark Office Action, U.S. Appl. No. 09/696,826, mailed on Dec. 27, 2001, 2 pages total.
Response to United States Patent and Trademark Office Action, U.S. Appl. No. 09/696,826, mailed on May 20, 2002 , 20 pages total.
Response to United Patent and Trademark Office Action, U.S. Appl. No. 09/696,826, mailed on Oct. 24, 2002, 13 pages total.
Response to United Patent and Trademark Office Action, U.S. Appl. No. 06/686,826, mailed on Jun. 24, 2003, 9 pages total.
Response to United Patent and Trademark Office Advisory Action and Supplemental Advisory Action, U.S. Appl. No. 09/696,826, mailed on Dec. 23, 2002, 14 pages total.
U.S. Appl. No. 09/758,792.
U.S. Appl. No. 10/637,848, filed Aug. 7, 2003, Chow et al.
U.S. Appl. No. 10/789,261, filed Feb. 26, 2004, Baukus et al.
U.S. Appl. No. 10/881,286, filed Jun. 29, 2004, Chow et al.
Document No. 02237038, dated Dec. 6, 1990, Patent Abstracts of Japan, vol. 014, No. 550 (E-1009).
Document No. 63129647, dated Jun. 2, 1988, Patent Abstracts of Japan, vol. 012, No. 385 (E-668), Oct. 14, 1998.
Patent Abstracts of Japan, vol. 016, No. 197 (p. 1350) May 12, 1992 & JP-A-40 28 092 (Toshiba Corp), abstract.
Fredericksen, T.M., "A Multiple-Layer-Metal CMOS Process," *Intuitive CMOS Electronics*, Revised Edition, Section 5.6, pp. 134-146 (1989).
Hodges and Jackson, *Analysis and Design of Digital Integrated Circuits*, 2nd edition, McGraw-Hill, p. 353 (1988).
Larson, L.E., et al., "Microactuators for GaAs-based Microwave Integrated Circuits," *IEEE*, pp. 743-746 (1991).
Lee, "Engineering a Device for Electron-beam Probing," *IEEE Design and Test of Computers*, pp. 36-49 (1989).
Sze, S.M., ed. *VLSI Technology*, McGraw-Hill, pp. 99, 447, and 461-465 (1983).
Sze, S.M., ed., "Silicides for Gates and Interconnections," *VLSI Technology*, McGraw-Hill, pp. 372-380 (1983).

* cited by examiner

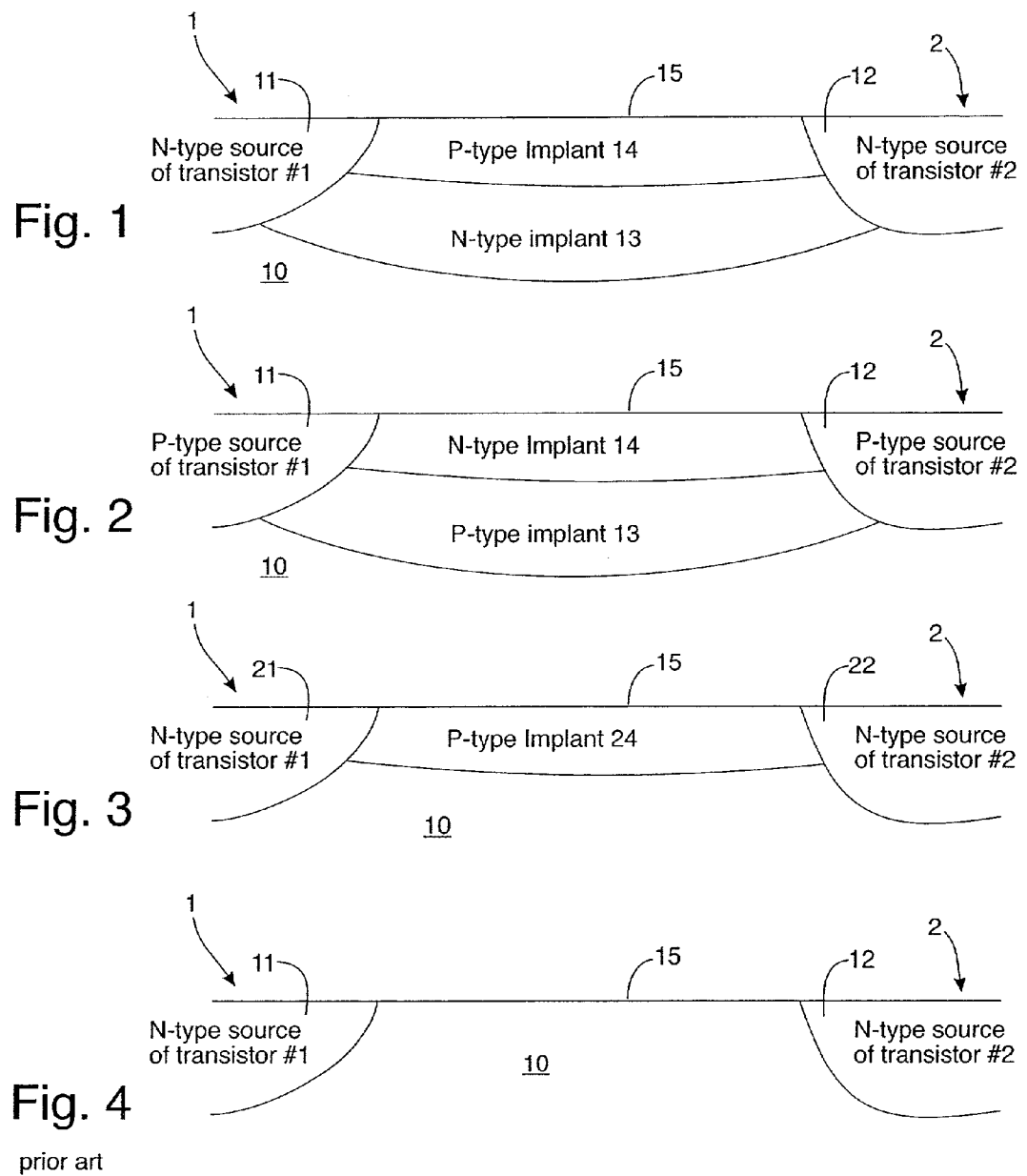

IMPLANTED HIDDEN INTERCONNECTIONS IN A SEMICONDUCTOR DEVICE FOR PREVENTING REVERSE ENGINEERING

CROSS REFERENCE TO RELATED APPLICATION

This application in a continuation in part of U.S. Ser. No. 09/696,826 filed Oct. 25, 2000, now U.S. Pat. No. 6,815,816 the disclosure of which is hereby incorporated herein by reference.

TECHNICAL FIELD

The present invention relates to semiconductor devices and their methods of manufacture wherein the semiconductor devices have implanted interconnections which are hidden and/or camouflaged so as to inhibit or prevent reverse engineering of the semiconductor device.

BACKGROUND OF THE INVENTION

The design and development of semiconductor Integrated Circuits (ICs) tends to be rather expensive and, in fact, many hours of engineering talent are required to develop the complex structures, processes and manufacturing techniques involved in making modern semiconductor devices and ICs. Indeed, semiconductor ICs over the years have become more complex and therefore the effort involved in achieving a successful design has become very expensive. Many man-hours of highly skilled professional time are required at a considerable expense to design and develop a modem integrated circuit.

Others, in order to avoid not only the expense involved in the design and development of integrated circuits, but also to avoid the significant time involved in bringing a new integrated circuit design to the market place, resort to reverse engineering practices for existing integrated circuits to take apart, probe, and otherwise examine these existing ICs to try to determine the physical structures and methods used to make the integrated circuit for subsequent copying. This reverse engineering, which typically relies primarily on obtaining planar optical images of a circuit, in essence tries to bypass the typical product development cycles and expenses involved in producing integrated circuits.

Since the reverse engineer is trying to go for a "free ride" on the efforts of others, various approaches have been developed to try to thwart the reverse engineer, particularly in the field of semiconductor integrated circuits. See, for example, U.S. Pat. No. 4,583,011 wherein the device is given a depletion implant that is virtually invisible to a reverse engineer.

Integrated circuits typically comprise a large number of active devices, typically in the form of transistors, diodes, and the like, which are electrically connected by the means of interconnects. The interconnects are often provided by metallic structures which are formed on various levels within an integrated circuit device. Since these metallic structures etch away in the presence of an appropriate etchant at a different rate compared to the other structures found in a semiconductor device (such as semiconducting material, insulating material, and the like), the reverse engineer can discover the presence and the structure of metallic conductors used to interconnect the active devices in an integrated circuit by putting the needed time and energy into the reverse engineering task. However, since this time and energy is less than that required to design a new IC, reverse engineering has its followers. Indeed, the reverse engineer's object is to make a working, slavish copy of the original IC, caring little about how the original IC was designed. The reverse engineer does not seem to be deterred by the fact that in many countries existing ICs are legally protected against copying by some form of mask works protection. As such, in order to protect the considerable investment made in new IC designs, other or additional steps are needed to deter such slavish copying.

SUMMARY OF THE INVENTION

The present invention provides a method and apparatus for preventing reverse engineering of integrated circuits by hiding interconnects between various devices and structures (for example, diodes, transistors, input/output connections, power supply connections and the like) so as to make it much more difficult for the reverse engineer to determine how the devices and structures, which can be seen on an integrated circuit, are interconnected.

In one aspect, the present invention provides an interconnect for interconnecting two spaced-apart implanted regions of a common conductivity type in an integrated circuit or device. The interconnect comprises a first implanted region forming a conducting channel between the two spaced-apart implanted regions, the conducting channel being of the same common conductivity type and bridging a region between the two spaced-apart regions, and a second implanted region of opposite conductivity type, the second implanted region being disposed between the two spaced-apart implanted regions of common conductivity type and being disposed over the conducting channel.

In another aspect the present invention provides a method of providing and camouflaging an interconnect between two adjacent implanted regions in an integrated circuit or device, the two adjacent implanted regions being of a common conductivity type. The method includes forming a first region of the same common conductivity type, the first region being disposed between locations where said two adjacent implanted regions either have been or will be formed; and forming a second region of opposite conductivity type to the common conductivity type, the second region over-lying the first region and having a concentration profile normal to a major surface of the integrated circuit or device with a concentration peak closer to the major surface of the semiconductor device than a concentration peak for the first region.

BRIEF DESCRIPTION OF THE DRAWINGS

FIG. 1 shows a side sectional view through a semiconductor device or IC showing a portion of two active devices with a hidden channel providing an interconnect there between;

FIG. 2 is similar to FIG. 1, but the priority types of the devices and the interconnect have been reversed, compared to FIG. 1;

FIG. 3 is similar to FIG. 1, but no interconnect is provided between the active areas of the two transistors;

FIG. 4 is similar to FIG. 3, but the camouflaging region shown in FIG. 3 has been omitted;

DETAILED DESCRIPTION

Figure 5:
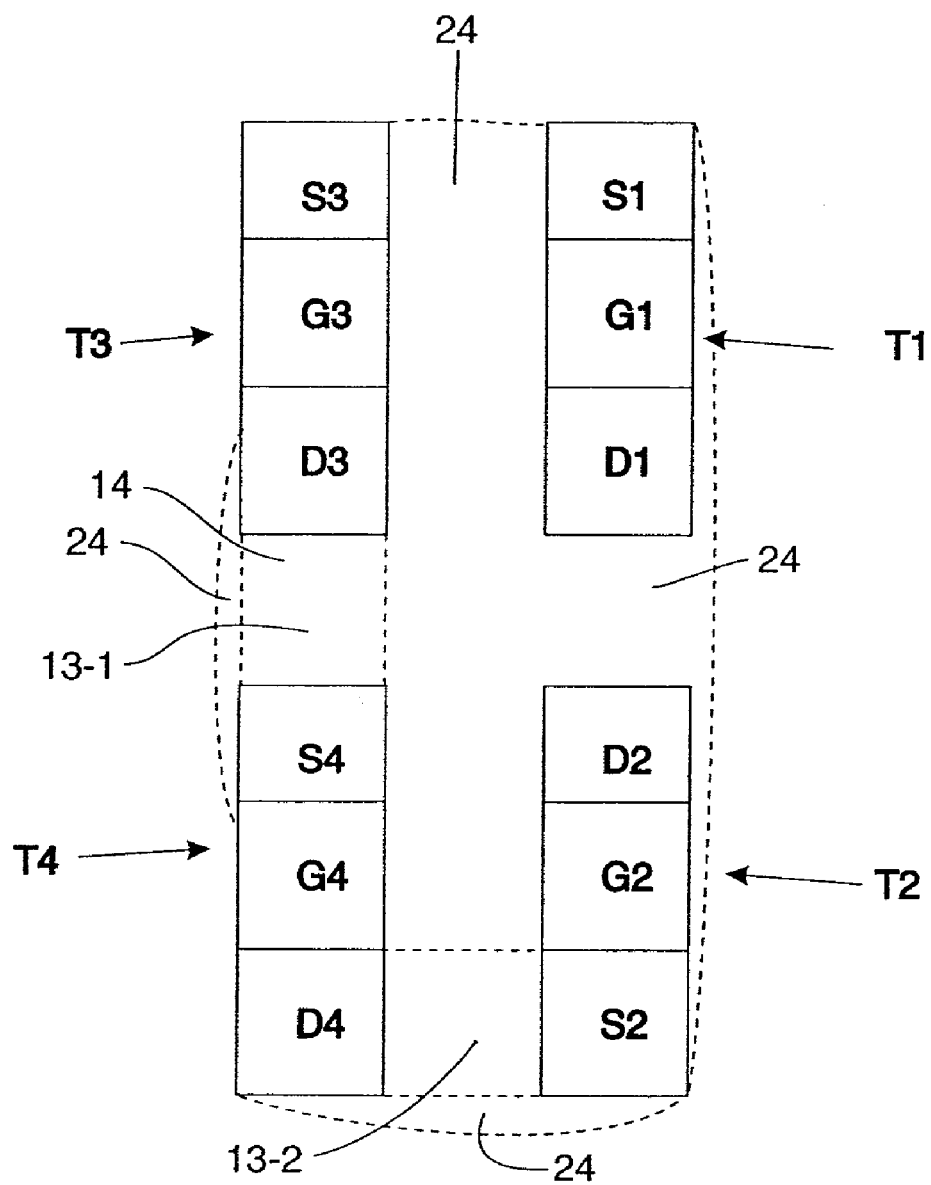
FIG. 5 is a plan view of a semiconductor device or IC having a number of active regions of active devices, some of which are interconnected in accordance with the present invention.

FIG. 1 is a cross sectional view through a portion of a two interconnected active devices 1, 2 in an integrated circuit. Only a portion of two active devices are shown in FIG. 1 since this invention is concerned with techniques for camouflaging the interconnections rather than with the structure of the devices per se. The depicted portion of active device 1 is a N-type region 11 that could provide the drain, for example, of a first FET transistor 1 and could be formed as an implanted region with a N-type dopant by techniques very well known in the art. Those skilled in the art will recognize, of course, that the N-type region 11 could alternatively form a portion of a diode, a portion of a bipolar transistor or a portion of some other semiconductor structure. The depicted portion of active device 2 is a N-type region 12 that could form the source, for example, of a second FET transistor 2. The function or functions attributed to regions 11 and 12 are not particularly important to the present invention and they could represent any active region of a semiconductor structure as a matter of design choice.

A complicated integrated circuit can literally comprise millions of active regions. Of course, not all active regions or devices are connected to an immediately adjacent active region or device although that is not infrequently the case. With respect to FIG. 1, it is assumed that active region 11 and active region 12 require, due to the design of the integrated circuit device in which they are used, interconnection. In the prior art, they might well have been interconnected by providing a thin layer of gold, aluminum or other metallic conductor on the presently exposed surface 15 between implanted regions 11 and 12. However, according to this embodiment of the present invention, regions 11 and 12 are interconnected by a N-type implanted region 13 which provides a conduction channel that interconnects the two active regions 11, 12. In order to camouflage the N-type implant 13, an implant of opposite conductivity type, for example, an implant of P-type conductivity, is implanted in a shallower region 14 immediately above the conductive channel formed by region 13. A person skilled in the art will now appreciate that any one or more of the above implanted or active regions may be formed by diffusion instead of implantation, if desired.

Those skilled in the art will realize that if the P-type implant 14 were not employed, the N-type implant 13, which has a tendency to extend towards the surface 15 of the semiconductor device shown in FIG. 1, might be discoverable by stain and etch techniques. Depending on the type of implantation used, the concentration of the N-type dopant could well be higher in regions below surface 15 compared to regions immediately adjacent surface 15. The relatively deeper N-type implant 13 provides a conduction path and will most likely have a relatively high dose of dopant to form the implant (for example, the amount of dosage of the dopant in the conduction path implant 13 could be the same as the dosage used to implant the active regions 11 and 12). The camouflaging implant, namely implant 14, is also a relatively heavy implant, as to camouflage the opposite conductivity type material in region 13 forming the conducting channel. However, the camouflaging implant 14 is relatively shallow compared to the depth of the conducting implant 13.

Those skilled in the art will appreciate that the action regions 11 and 12, for example, may be formed before, after or concurrently with the formation of the conduction path 13.

Preferably the depth of the camouflaging implant 14 will be on the order of 0.1 µm while the depth of the conducting channel implant 13 will be on the order of 0.2 µm for FET transistor structures of the type partially depicted in FIG. 1. In the case of FET transistor structures, those skilled in the art will appreciate that active regions 11, 12 depicted in FIG. 1 would often form source and drain contacts of such FET transistor structures.

Those skilled in the art will appreciate that the camouflaging implant 14 being a P-type implant between N-type region 11 and N-type region 12 will not provide a conducting path. The depth of the implants are controlled, as is well known in the art, by the energy used in the implanting process. Preferably, the camouflaging implant 14 is formed first and by a relatively lower energy level compared to the implant which will form the conducting channel implant 13. Implanted region 14 should have the peak of its distribution range lying close to the surface. Thereafter, a relatively higher energy implant is performed to form region 13. The second implant, having a higher energy, should have the peak of its distribution range lying at least 2σ distances away from the peak of the range distribution peak for implanted region 14. The value σ corresponds to the range profile distribution width for implant 14.

While implanting the conduction path 13 and the camouflaging region 14 is the preferable method of practicing the invention, one skilled in the art will appreciate that there are other semiconductor manufacturing methods that may be used to achieve the same or similar results. For example, instead of (or in addition to) using implantation to form the active regions 11, 12, conduction path 13 and the camouflaging region 14, any one or more of these regions may be formed by diffusion. Diffusion makes use of dopant atoms which span a wide range of concentrations. These dopant atoms may be introduced into the substrate 10 in ways well known to those skilled in the art, such as 1) diffusion from a chemical source in a vapor form at high temperatures, 2) diffusion from a dopant-oxide source, or 3) diffusion and annealing from an ion implanted layer.

The depths of the regions 11, 12, 13 or 14, if formed through diffusion, are controlled by the dopant atoms and the temperatures used in the diffusion process. When a diffusion process is used, the conduction path 13 is preferably formed before the camouflaging region 14. The camouflaging region 14 may then be formed either through the diffusion process or by the implantation, as discussed above. One skilled in the art will appreciate that there are well known techniques used in modern processes relating to diffusion depths and lateral extents that are preferably followed so that the conductivity of the various regions is controlled.

Due to the fact that some reverse engineers have etch and/or stain processes that can differentiate between N-type and P-type regions, the reverse engineer with such capabilities might infer the presence of the hidden conducting channel 13 by noting the presence of camouflaging region 14 if the camouflaging region 14 only occurred when it was used to hide conducting channel 13. The reverse engineer might observe region 14 (assuming the reverse engineer is able to differentiate it from regions 11 and 12 due to its different conductivity type) and, note that it does not provide a conduction path itself, therefore enabling the reverse engineer to conclude that region 14 has no purpose except to hide an underlying implanted region 13. Thus, the reverse engineer might also infer the presence of a conducting channel between regions 11 and 12 by the presence of the camouflaging region 14. In order to thwart the reverse engineer with such capabilities, the relatively shallow implant 14 should be used in other places where no interconnect is desired to be formed between two adjacent active regions. See, for example, FIG. 3 where there are active regions 21 and 22 are associated with two different active devices. Those skilled in the art realize that when you have two adjacent active regions they may or may not be interconnected due to the particular design requirements of the circuit. In FIG. 3 it is assumed that the two regions 21, 22 are not interconnected, but nevertheless a camouflaging P-type implant region 24 is formed between them. By using the structure shown in FIG. 1 in some areas (where interconnects are needed) and the structure shown in FIG. 3 in other areas (where interconnects are not desired), the reverse engineer will not be able to infer the presence of an interconnect by the presence of the camouflaging implant 14, 24. Of course, camouflaging implants 14 and 24 can be formed at the same time, if desired. They are given different reference numerals simply for the ease of discussion and depiction.

The configurations shown in FIGS. 1 and 3 will be repeated over and over again on a semiconductor chip, possibly more than a million times depending upon the complexity of the chip. Indeed, the camouflaging implant 14, 24 may be used over essentially 100% of the area of the chip dedicated for use as interconnections and where interconnections between active regions could plausibly occur, but do not occur. As such said camouflaging implant 14, 24 preferably has a larger area, when viewed in a direction normal to a major surface of the integrated circuit or device, than the area of the conductive channels camouflaged thereby. If the reverse engineer can not infer the presence of a conductive channel merely by the presence of the camouflaging implant 14, 24, it makes the reverse engineer have to work all that much harder to try to determine just how the active regions in an integrated circuit are interconnected. Given the fact that there can be millions of interconnections and even more places where an interconnection could exist (but does not due to the particular requirements of the circuitry on the integrated circuit chip), this invention makes it impracticable for the reverse engineer to try to work out just where the interconnection do exist.

Of course, some practicing the present invention may elect not to use a camouflaging implant 14, 24 in certain regions between two active devices, as is shown in FIG. 4, to confuse matters further for the reverse engineer. Thus, in some places, the implanted channel 13 of FIGS. 1 and 2 might be used without a camouflaging implant 14.

The more you confuse a reverse engineer, the more apt you are to thwart him at reverse engineering any particular integrated circuit. Therefore, other interconnection schemes can also be used in a particular IC design to further camouflage how the active regions are interconnected. Since there are millions of active regions in a large modern IC, different methods of interconnection can be combined for use together on a single IC. For example, in U.S. Pat. No. 5,866,933 a shallow implant is used to provide an interconnection between two active regions. Thus, some practicing the present invention for some interconnects on a chip may decide to use other inventions, including the invention of our prior U.S. Pat. No. 5,866,933 in order to provide other interconnections. The more you confuse the reverse engineer, the better chance you have of thwarting his efforts.

Those skilled in the art will realize that when the present invention is used in connection with the manufacture of semiconductor devices and ICs, the processes used to fabricate such ICs and devices may require additional processing steps to use the present invention or it may be possible to utilize the present invention, by modifying the masks for making a integrated circuit, without adding additional processing steps. It basically depends upon the fabrication processes used by a manufacturer of integrated circuits. Thus, for some manufacturers, they should be able to implement the present invention without adding to the cost of manufacturing semiconductor devices and integrated circuits. For others, additional processing steps will be involved, which will add to the cost of making a semiconductor device or IC. However, the additional cost of making the device or IC may well be justified in view of the fact that the resulting device will be more robust against reverse engineering.

FIG. 2 is similar to FIG. 1, but the conductivity types of the various regions have been reversed. While those skilled in the art will realize that the N-type regions 11 and 12 forming the drain of a first transistor 1 and the source of a second transistor 2 is a situation which will frequently arise in an integrated circuit, the configuration of FIG. 2 can occur and therefore is depicted for the sake of completeness. P-type versions of the structures shown in FIGS. 3 and 4 are not included herein for the sake of brevity as those P-type structures are readily apparent to those skilled in the art.

FIG. 5 is a plan view of a small portion of an IC. Four FET transistors T1–T4 are depicted together with the drains D1–D4, sources S1–S4 and gates G1–G4. Drain D3 and source S4 are depicted as being interconnected by a buried implant 13-1. Drain D4 and source S2 are depicted as being interconnected by a buried implant 13-2. The regions in which interconnections could plausibly occur, but do not occur, and the regions overlying buried interconnects 13-1 and 13-2 are all covered with a camouflaging implant 14, 24. As previously indicated, camouflaging implant 14, 24 is preferably implanted during a single implant process and is only given different numerals herein to differentiate when it overlies an interconnect (labeled numeral 14) and when it overlies regions where interconnections could plausibly occur, but do not occur (labeled numeral 24). The regions where buried interconnection 13 do or do not occur are governed by the particular function or functions to be performed by the IC in question. In the embodiment of FIG. 5 it is clear that the camouflaging implant 14, 24 has a significantly larger area, when viewed in a direction normal to a major surface 15 (See FIGS. 1 & 3) of in the IC, than the area of the conductive channels 13-1 and 13-2 camouflaged thereby.

Those skilled in the art will appreciate that the devices T1–T4, while they are identified here as FETs in this embodiment, can represent other types of semiconductor devices with active regions some of which are interconnected by a conducting channel such as the channel 13-2 between S2 and D4 or the conducting channel 13-I between S4 and D3. Of course, other or different interconnection patterns might well be used in practice. In any case, the conductivity type of regions 13-1, 13-2, D1, S2 and S4 (as well as the other active regions) would preferably be of a common conductivity type in this example and, for many integrated circuits, of N-type conductivity.

Having described the invention with respect to a preferred embodiment thereof, modification will now no doubt suggest itself to those skilled in the art. As such, the invention is not to be limited to the disclosed embodiments except as required by the appended claims.

What is claimed is:

1. A method of providing and camouflaging an interconnect between spaced-apart active regions in an integrated circuit or device, the two spaced-apart active regions being of a common conductivity type, said method comprising:
forming a first region of said common conductivity type, said first region being in electrical communication with said spaced-apart active regions; and
camouflaging said first region by forming a second region of opposite conductivity type to said common conductivity type, said second region overlying at least said first region.

2. The method of claim 1, wherein the spaced-apart active regions are formed before formation of the first region.

3. The method of claim 1, wherein the spaced-apart active regions are formed after formation of the first region.

4. The method of claim 1, wherein the spaced-apart active regions are formed concurrently with the first region.

5. The method of claim 1, wherein said first region and said second region are formed by implantation and said second region having a concentration profile normal to a major surface of said integrated circuit or device with a concentration peak closer to said major surface of the integrated circuit or device than a concentration peak for the first region.

6. The method of claim 5, wherein said first region is implanted at a higher energy than said second region.

7. The method of claim 5, wherein said second region is implanted before said first region is implanted.

8. The method of claim 5, wherein said first region is implanted during the implantation of active regions associated with transistors formed in said integrated circuit or device.

9. The method of claim 8 wherein said active regions are source and/or drain regions and wherein said transistors are FET devices formed in said integrated circuit or device.

10. The method of claim 1, wherein the step of forming a second region of opposite conductivity type to said common conductivity type includes forming said second region in regions of said integrated circuit or device where interconnections between active regions could plausibly occur but do not occur.

11. The method of claim 1, wherein at least one of said spaced-apart active regions, said first region and said second region is formed by diffusion.

12. The method of claim 1 wherein the spaced-apart active regions are each associated with spaced-apart and distinct semiconductor devices in said integrated circuit.

13. A method of confusing a reverse engineer comprising:
providing conduction channel in a semiconductor device disposed laterally of and in direct contact with two active regions disposed in said semiconductor device, said conduction channel and said two active regions being of the same conductivity type; and
hiding from the reverse engineer said conduction channel by forming a camouflaging region overlying at least said conduction channel, said camouflaging region being of an opposite conductivity type.

14. The method of claim 13, wherein said conduction channel and said camouflaging region are formed by implantation and said camouflaging region having a concentration profile normal to a major surface of said semiconductor device with a concentration peak closer to said major surface of the semiconductor device than a concentration peak for the conduction channel.

15. The method of claim 13, wherein said conduction channel is implanted at a higher energy than said camouflaging region.

16. The method of claim 15, wherein said camouflaging region is implanted before said conduction channel is implanted.

17. The method of claim 15, wherein said conduction channel is implanted during the implantation of active regions associated with transistors formed in said integrated circuit or device.

18. The method of claim 16 wherein said active regions are source and/or drain regions and wherein said transistors are FET devices formed in said semiconductor device.

19. The method of claim 13, further comprising the step of providing at least one additional region of opposite conductivity type, said at least one additional region being disposed laterally and in direct contact with said two active regions, whereby said two active regions are not electrically connected.

20. The method of claim 13, wherein at least said two adjacent active regions, said conduction channel or said camouflaging region is formed by diffusion.

21. The method of claim 13, wherein the camouflaging region is also formed in portions of said semiconductor device such that the camouflaging region covers portions of said semiconductor device having no conduction channel formed beneath the camouflaging region.

22. The method of claim 13 wherein the providing step includes providing a plurality of conduction channels in the semiconductor device, the conduction channels being disposed laterally of and in direct contact with associated active regions disposed in said semiconductor device, said conduction channels being of the same conductivity type as are their associated active regions.

23. The method of claim 22, wherein the camouflaging region covers said plurality of conduction channels and is additionally formed in portions of said semiconductor device such that the camouflaging region covers portions of said semiconductor device having no conduction channel formed beneath the camouflaging region.

24. The method of claim 13 wherein the two active regions are each associated with spaced-apart and distinct semiconductor devices in said integrated circuit.

25. A method of providing and camouflaging an interconnect between spaced-apart active regions in an integrated circuit or device, the two spaced-apart active regions being of a first conductivity type, said method comprising:
forming a first region of said first conductivity type, said first region being in electrical communication with said spaced-apart active regions and being formed after formation of said two spaced-apart active regions; and
camouflaging said first region by forming a second region of opposite conductivity type to said common conductivity type, said second region overlying at least said first region.

* * * * *